United States Patent [19]
Walker et al.

[11] Patent Number: 5,572,059
[45] Date of Patent: Nov. 5, 1996

[54] THERMAL ISOLATION OF HYBRID THERMAL DETECTORS THROUGH AN ANISOTROPIC ETCH

[75] Inventors: William K. Walker, Plano; Steven N. Frank, McKinney; Charles M. Hanson, Richardson; Robert J. S. Kyle, Rowlett; Edward G. Meissner, Dallas; Robert A. Owen, Rowlett; Gail D. Shelton, Mesquite, all of Tex.

[73] Assignee: Texas Instruments Incorporated, Dallas, Tex.

[21] Appl. No.: 477,718

[22] Filed: Jun. 7, 1995

Related U.S. Application Data

[62] Division of Ser. No. 236,778, Apr. 29, 1994, Pat. No. 5,478,242.

[51] Int. Cl.⁶ .................................................. H01L 27/095
[52] U.S. Cl. .......................... 257/448; 257/446; 257/467; 257/623; 250/338.1; 250/338.2; 250/338.3; 250/338.4
[58] Field of Search .................................... 257/467, 466, 257/448, 623; 250/338.1, 338.2, 338.3, 338.4, 339.04

[56] References Cited

U.S. PATENT DOCUMENTS

| | | | |
|---|---|---|---|
| 3,846,820 | 11/1974 | Lampe et al. | 357/31 |
| 4,018,608 | 4/1977 | Frazier | 96/27 |
| 4,080,532 | 3/1978 | Hopper | 250/332 |
| 4,142,207 | 2/1979 | McCormack et al. | 358/113 |
| 4,143,269 | 3/1979 | McCormack et al. | 250/342 |
| 4,162,402 | 7/1979 | Hopper | 250/332 |
| 4,205,227 | 5/1980 | Reed | 250/330 |
| 4,275,302 | 6/1981 | Imbert et al. | 250/330 |
| 4,379,232 | 4/1983 | Hopper | 250/332 |
| 4,593,456 | 6/1986 | Cheung | 29/573 |
| 4,594,507 | 6/1986 | Elliott et al. | 250/331 |
| 4,705,361 | 11/1987 | Frazier et al. | 350/355 |
| 4,740,700 | 4/1988 | Shaham et al. | 250/338.3 X |
| 4,751,387 | 6/1988 | Robillard | 250/331 |
| 4,815,199 | 3/1989 | Jenner et al. | 250/338.3 X |
| 4,927,771 | 5/1990 | Ferrett | 437/3 |
| 4,994,672 | 2/1991 | Cross et al. | 250/330 |
| 5,010,251 | 4/1991 | Grinberg et al. | 250/332 |
| 5,021,663 | 6/1991 | Hornbeck | 25/349 |
| 5,047,644 | 9/1991 | Meissner et al. | 250/332 |
| 5,051,591 | 9/1991 | Trotta et al. | 250/351 |
| 5,193,911 | 3/1993 | Nix et al. | 374/121 |

(List continued on next page.)

FOREIGN PATENT DOCUMENTS

| | | |
|---|---|---|
| 107233 | 9/1971 | Canada . |
| 2 111 746 | 9/1971 | Germany . |
| 27 52 704 | 11/1977 | Germany . |
| 2 251 952 | 9/1990 | United Kingdom . |
| WO91 00162 | 4/1991 | WIPO . |

Primary Examiner—William Mintel
Attorney, Agent, or Firm—Bret J. Petersen; James C. Kesterson; Richard L. Donaldson

[57] ABSTRACT

A thermal isolation structure (10) is disposed between a focal plane array and an integrated circuit substrate (12). The thermal isolation structure (10) includes a mesa-type formation (16) and a mesa strip conductor (18, 26) extending from the top of the mesa-type formation (16) to an associated contact pad (14) on the integrated circuit substrate (12). After formation of the mesa-type formation (16) and the mesa strip conductor (18, 26), an anisotropic etch using the mesa strip conductor (18, 26) as an etch mask removes excess mesa material to form trimmed mesa-type formation (24) for improved thermal isolation. Bump bonding material (20) may be deposited on mesa strip conductor (18, 26) and can also be used as an etch mask during the anisotropic etch. Thermal isolation structure (100) can include mesa-type formations (102), each with a centrally located via (110) extending vertically to an associated contact pad (104) of integrated circuit substrate (106). A conductor (108) is deposited on top of mesa-type formation (102), along the walls of via (110), and overlaying contact pad (104). An anistropic etch using the conductor (108) as an etch mask removes excess mesa material (118) for improved thermal isolation.

8 Claims, 2 Drawing Sheets

U.S. PATENT DOCUMENTS

| | | | |
|---|---|---|---|
| 5,196,703 | 3/1993 | Keenan | 250/332 |
| 5,198,370 | 3/1993 | Ohkura et al. | 437/3 |
| 5,264,326 | 11/1993 | Meissner et al. | 430/313 |
| 5,265,699 | 11/1993 | Barton et al. | 250/338.4 |
| 5,268,310 | 12/1993 | Goodrich et al. | 437/15 |
| 5,288,649 | 2/1994 | Keenan | 437/3 |
| 5,424,544 | 6/1995 | Shelton et al. | 250/338.3 X |
| 5,436,450 | 7/1995 | Belcher et al. | 250/338.2 X |
| 5,485,010 | 1/1996 | Owen et al. | 250/338.3 X |

THERMAL ISOLATION OF HYBRID THERMAL DETECTORS THROUGH AN ANISOTROPIC ETCH

This is a division of application Ser. No. 08/236,778, filed on Apr. 29, 1994, now U.S. Pat. No. 5,478,242.

RELATED APPLICATIONS

This application is related to copending application Ser. No. 08/182,865, entitled Infrared Detector and Method, and copending application Ser. No. 08/182,268, entitled Infrared Detector and Method, both applications of the same assignee.

TECHNICAL FIELD OF THE INVENTION

This invention relates to a thermal isolation structure for hybrid solid state systems, and more particularly to thermal detection systems and methods of fabrication.

BACKGROUND OF THE INVENTION

One common application for thermal sensors is in thermal (infrared) detection devices such as night vision equipment. One such class of thermal detection devices includes a focal plane array of infrared detector elements or thermal sensors coupled to an integrated circuit substrate with a corresponding array of contact pads between the focal plane array and the integrated circuit substrate. The thermal sensors define the respective picture elements or pixels of the resulting thermal image.

One type of thermal sensor includes a pyroelectric element formed from a pyroelectric material, such as barium strontium titanate (BST), that exhibits a state of electrical polarization dependent upon temperature changes in response to thermal radiation. For one such thermal sensor, an infrared absorber and common electrode assembly is disposed on one side of the associated pyroelectric element. A sensor signal electrode is disposed on the opposite of the pyroelectric element. The infrared absorber and common electrode assembly typically extends across the surface of the focal plane array and is coupled to the pyroelectric element of each thermal sensor in the focal plane array. Each pyroelectric element has its own separate sensor signal electrode. Each infrared detector element or thermal sensor is defined, in part, by the infrared absorber and common electrode assembly and a respective sensor signal electrode, which constitute capacitive plates, and a respective pyroelectric element, which constitutes a dielectric disposed between the capacitive plates.

To maximize thermal response and enhance thermal image accuracy, each pyroelectric element of the focal plane array is preferably isolated thermally from the associated integrated circuit substrate to insure that the sensor signal from each thermal sensor accurately represents incident infrared radiation. Thermal isolation structures are typically disposed between the focal plane array and the integrated circuit substrate to provide both mechanical support and a sensor signal flowpath, while minimizing thermal coupling between the thermal sensors and the integrated circuit substrate. Several approaches have been used to provide a thermal isolation structure between-thermal sensors and an underlying integrated circuit substrate.

SUMMARY OF THE INVENTION

In accordance with the present invention, the disadvantages and problems associated with previous thermal isolation structures used to couple, both mechanically and electrically, component structures of a hybrid thermal detection system have been substantially reduced or eliminated. The present invention provides enhanced thermal isolation of a hybrid thermal detection system through an anisotropic etch of excess material used to form mesa-type formations disposed between the focal plane array and the integrated circuit substrate.

In one aspect of the present invention a method is disclosed for fabricating a thermal isolation structure disposed between a focal plane array and an integrated circuit substrate of a hybrid thermal detection system. The focal plane array is provided with thermal sensors for generating a sensor signal output representative of thermal radiation incident to the focal plane array. The integrated circuit substrate may be provided with contact pads for coupling to the focal plane array. Mesa-type formations are preferably formed from thermally insulating material to project adjacent to the contact pads of the integrated circuit substrate. Mesa strip conductors are formed to extend from the top of the mesa-type formations to the contact pads of the integrated circuit substrate. Each mesa strip conductor can be formed to couple at least one of the thermal sensors in the focal plane array to the integrated circuit substrate. The mesa-type formations are then anisotropically etched using the mesa strip conductors as an etch mask.

In accordance with another aspect of the present invention a method is disclosed for fabricating a thermal isolation structure disposed between a focal plane array and an integrated circuit substrate of a hybrid thermal detection system. The focal plane array is provided with thermal sensors for generating a sensor signal output representative of thermal radiation incident to the focal plane array. The integrated circuit substrate is provided with contact pads for coupling to the focal plane array. The integrated circuit substrate is typically coated with a mesa material of substantially uniform thickness. Vias are formed through the mesa material using an anisotropic etch, each via terminating at a contact pad of the integrated circuit substrate. Conductors may be formed to extend from the surface of the mesa material through the vias to the contact pads of the integrated circuit substrate. Each conductor may be formed to couple at least one of the thermal sensors in the focal plane array to the associated contact pad disposed on the integrated circuit substrate. The portion of the conductors formed on the surface of the mesa material may be patterned as desired. The mesa material is anisotropically etched using the patterned conductors as an etch mask to form the desired mesa-type formations. Each mesa-type formation supports an associated conductor.

In accordance with another aspect of the present invention a hybrid thermal detector includes a focal plane array mounted with a thermal isolation structure on an integrated circuit substrate. Thermal sensors in the focal plane array provide a sensor signal output representative of thermal radiation incident to the focal plane array. Contact pads, disposed on the integrated circuit substrate, couple the integrated circuit substrate to the focal plane array. Mesa-type formations project adjacent to the contact pads of the integrated circuit substrate. Mesa strip conductors extend from the top of mesa-type formations to the contact pads of the integrated circuit substrate. Each mesa strip conductor couples at least one of the thermal sensors in the focal plane array to the integrated circuit substrate. Each mesa strip conductor may include a bonding area disposed on the top of the respective mesa-type formation and a voltage lead coupling the bonding area to an associated contact pad. The mesa-type formations are substantially defined by a vertical projection of the mesa strip conductors on the integrated circuit substrate.

In accordance with another aspect of the present invention a hybrid thermal detector includes a focal plane array mounted with a thermal isolation structure on an integrated circuit substrate. Thermal sensors in the focal plane array provide a sensor signal output representative of thermal radiation incident to the focal plane array. Contact pads, disposed on the integrated circuit substrate, couple the integrated circuit substrate to the focal plane array. Mesa-type formations formed from a thermally insulating material are disposed over contact pads of the integrated circuit substrate. Conductors may extend vertically from the top of the mesa-type formations to the respective contact pads of the integrated circuit substrate. Each conductor typically has an associated mesa-type formation. Each conductor may include a bonding area disposed on the top of the mesa-type formation and a voltage lead disposed in a via formed in the center of the mesa-type formation. The voltage lead couples the top of the mesa-type formation to the associated contact pad disposed on the integrated circuit substrate.

Important technical advantages of the present invention can include minimizing overall thermal conductance between the focal plane array and the integrated circuit substrate by anisotropically etching to remove excess material used to form the mesa-type formations. Since the anisotropic etch uses a mesa strip conductor formed on the mesa-type formation as a mask, substantially all mesa material not directly beneath the mesa strip conductor is removed to improve overall thermal isolation. The resulting mesa-type formation is defined substantially by a vertical projection of the mesa strip conductor on the integrated circuit substrate. In one embodiment, bump-bonding material may be placed on the mesa strip conductor and also used as a mask during the anisotropic etch.

Other important technical advantages of the present invention can include that the anisotropic etch of the excess mesa material is inherently self-aligning. By using the mesa strip conductor, and optionally any bump-bonding material placed on the mesa strip conductor, as an etch mask, the anisotropic etch effectively removes mesa material not necessary to directly support the mesa strip conductor and bump-bonding material. In this manner, the step of anisotropically etching the mesa material is self-aligning to the mesa strip conductor and bump-bonding material.

Further important technical advantages of the present invention can include providing a mesa strip conductor with an oversized bonding area disposed on the top of the mesa-type formation and a relatively narrow signal lead coupling the oversized bonding area to the integrated circuit substrate. This variable geometry mesa strip conductor provides an oversized bonding area to electrically couple the thermal isolation structure to the focal plane array and a relatively narrow signal lead to maximize thermal isolation. In addition, an oversized contact region disposed on the integrated circuit and coupled to the signal lead provides easier alignment of the mesa strip conductor to a contact pad of the integrated circuit substrate. A mesa strip conductor with an oversized bonding area and contact region reduces fabrication complexity, especially for mesa strip conductors on taller mesa-type formations that demand good photoresist resolution on two levels.

Still further important technical advantages of the present invention can include forming mesa-type formations over each contact pad of the integrated circuit substrate and providing a conductor through the center of the mesa-type formation that couples the focal plane array to the underlying contact pad. This mesa-type formation provides self-alignment over the contact pad and uses a conductor of a very narrow width to improve thermal isolation. In addition, this mesa-type formation may be taller and therefore offer improved thermal isolation without introducing photoresist resolution problems since the centrally disposed conductor is deposited into a vertical bore. Any excess mesa material used to form the mesa-type formations may be removed by an anisotropic etch using the patterned conductor and optionally bump-bonding material as an etch mask.

BRIEF DESCRIPTION OF THE DRAWINGS

For a more complete understanding of the present invention, and for further features and advantages, reference is now made to the following description, taken in conjunction with the accompanying drawings, in which.

DETAILED DESCRIPTION OF THE INVENTION

Figure 1:
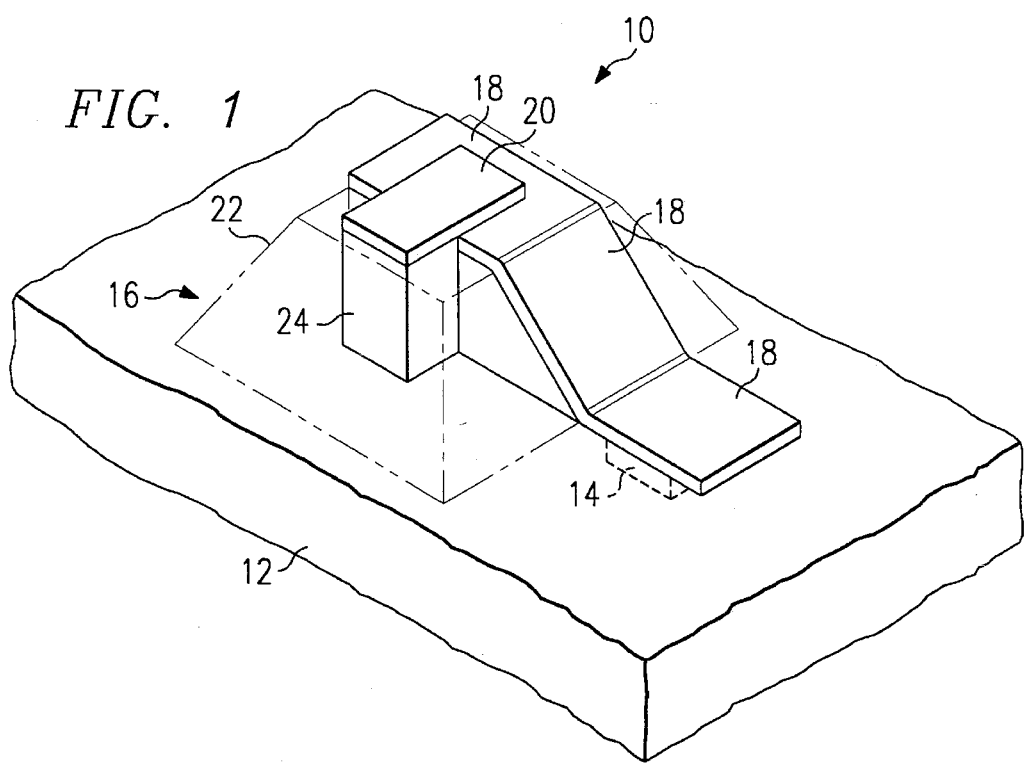
FIG. 1 is an isometric drawing showing a thermal isolation structure where excess mesa material, shown in phantom lines, has been removed through an anisotropic etch using the mesa strip conductor and bump-bonding material as an etch mask.

The preferred embodiments of the present invention and its advantages are best understood by referring to FIGS. 1–4 of the drawings, like numerals being used for like and corresponding parts of the various drawings.

Some infrared detectors and thermal detection systems are based upon either the generation of a change in voltage or current due to a change in temperature resulting from incident infrared radiation striking a thermal sensor or the generation of a change in voltage or current due to a photon-electron interaction within the material used to form the thermal sensor. This latter effect is sometimes called the internal photoelectric effect. Other infrared detectors and thermal detection systems are based upon the change in resistance or capacitance of a thermal sensor caused by the heating effect of incident infrared radiation. Such infrared detectors are sometimes referred to as bolometers.

Thermal detection systems constructed in accordance with the teachings of the present invention function based upon the generation of a change in voltage or current due to a change in temperature of pyroelectric material resulting from incident infrared radiation. However, the present invention may be used with other types of thermal detection systems including bolometers.

Some infrared detectors are hybrid solid state systems formed by mounting a focal plane array with a thermal isolation structure on an integrated circuit substrate. Typically, the thermal isolation structure includes a supporting structure and one or more sensor signal flowpaths mounted on the supporting structure for coupling the focal plane array and the integrated circuit substrate. Therefore, two contributors to thermal conductivity between the focal plane and the integrated circuit substrate are the supporting structure and the sensor signal flowpath.

One of the problems associated with previous thermal isolation structures is that excess material used for the supporting structure contributed to the thermal conductivity between the focal plane array and the integrated circuit substrate. The present invention solves this problem by using an anisotropic etch to remove excess mesa material used to form the supporting structure of a thermal isolation structure. The resulting supporting structure generally includes only the mesa material that directly supports the sensor signal flowpath, thereby improving thermal isolation.

Another problem associated with previous thermal isolation structures is the relatively high thermal conductivity associated with the electrically conductive sensor signal flowpath between the focal plane array and the associated integrated circuit substrate. In one embodiment, the present invention solves this problem by using a mesa strip conductor with a thin voltage lead to improve thermal isolation. In another embodiment, a conductor in a central bore of a mesa-type formation is formed with substantially less material by using a conformal deposition technique, such as chemical vapor deposition. In both embodiments, the use of less conductor material translates to improved thermal isolation between focal plane array and integrated circuit substrate.

The thermal isolation structure of the present invention applies to thermal detection systems where the thermal sensors are coupled to a common electrode to provide a voltage. The voltage provided by common electrode may be a negative, positive, or zero potential. The thermal isolation structure of the present invention may also be used in thermal detection systems with folded pixel thermal sensors, where each thermal sensor has its own sensor signal and voltage coupling to the integrated circuit substrate.

One embodiment of the present invention is shown in connection with the thermal isolation structure 10 depicted in FIG. 1. In general, thermal isolation structure 10 is used to provide mechanical support during bonding of a focal plane array with integrated circuit substrate 12. Thermal isolation structure 10 also thermally insulates the focal plane array from integrated circuit substrate 12 and provides electrical coupling between the focal plane array and integrated circuit substrate 12. Therefore, thermal isolation structure 10 provides the multiple functions of thermal isolation, structural support, and electrical coupling.

Various types of semiconductor materials and integrated circuit substrates may be used with the present invention. U.S. Pat. No. 4,143,269 entitled "Ferroelectric Imaging System," issued to McCormack, et al. and assigned to Texas Instruments Incorporated, provides information concerning infrared detectors fabricated from ferroelectric materials and a silicon switching matrix or integrated circuit substrate. U.S. Pat. No. 5,047,644 entitled "Polyimide Thermal Isolation Mesa For A Thermal Imaging System," issued to Meissner, et al. and assigned to Texas Instruments Incorporated, discloses a thermal isolation structure having thermal isolation mesa-type formations formed from polyimide.

Referring again to FIG. 1, thermal isolation structure 10 is formed adjacent to contact pad 14 of integrated circuit substrate 12. Contact pad 14 receives a sensor signal voltage generated by a focal plane array and passes this signal to integrated circuit substrate 12 through mesa strip conductor 18 of thermal isolation structure 10. Optionally, contact pad 14 may deliver bias voltage to a folded pixel thermal sensor (not shown) through mesa strip conductor 18 of thermal isolation structure 10.

Thermal isolation structure 10 comprises mesa-type formation 16 formed from any appropriate material, such as photosensitive or non-photosensitive polyimide. Disposed over mesa-type formation 16 is mesa strip conductor 18, which extends from the top of mesa-type formation 16, where focal plane array is coupled to thermal isolation structure 10, to the associated contact pad 14 of integrated circuit substrate 12. In one embodiment of the present invention, bump-bonding material 20 may be placed on mesa strip conductor 18 at the top of mesa-type formation 16. Bump-bonding material 20 facilitates bonding of thermal isolation structure 10 to a respective thermal sensor in the associated focal plane array.

Mesa-type formation 16 is shown in both a trimmed and untrimmed state. Untrimmed mesa-type formation 22, shown in phantom lines, includes material not directly beneath mesa strip conductor 18 and bump-bonding material 20. After an anisotropic etch, as described below, trimmed mesa-type formation 24 is defined substantially by a vertical projection of mesa strip conductor 18 and bump-bonding material 20 onto integrated circuit substrate 12.

Trimming excess mesa material not directly underlying mesa strip conductor 18 and bump-bonding material 20 improves thermal isolation between focal plane array and integrated circuit substrate 12. Trimmed mesa-type formation 24 contains a reduced amount of material to support mesa strip conductor 18 and bump-bonding material 20. Removal of material used to form mesa-type formation 16 results in a concomitant improvement in thermal isolation between focal plane array and integrated circuit substrate 12.

A typical process sequence to form thermal isolation structure 10 of FIG. 1 begins by applying the material used to form mesa-type formation 16, such as photosensitive or non-photosensitive polyimide or other suitable thermally insulating material, to integrated circuit substrate 12. Untrimmed mesa-type formation 22, shown in phantom lines, is then formed using a photolithographic process. Mesa strip conductor 18, comprising a titanium/tungsten alloy or other appropriate conductive material, is then applied to extend from the top of untrimmed mesa-type formation 22 to contact pad 14 of integrated circuit substrate 12. Mesa strip conductor 18 is patterned to provide electrical coupling between focal plane array and integrated circuit substrate 12.

The process continues by optionally applying bump-bonding material 20 over the portion of mesa strip conductor 18 at the top of untrimmed mesa-type formation 22, where the focal plane array will be bonded to thermal isolation structure 10. The process of forming thermal isolation structure 10 concludes by anisotropically etching untrimmed mesa-type formation 22 to remove excess material leaving trimmed mesa-type formation 24. The anisotropic etch may be, for example, an oxygen-based reactive ion etch (RIE) or a magnetically-enhanced reactive ion etch (MERIE).

The anisotropic etch of untrimmed mesa-type formation 22 may be normal to integrated circuit substrate 12, resulting in a trimmed mesa-type formation 24 defined substantially by a vertical projection of the mesa strip conductor 18 and/or bump-bonding material 20 on integrated circuit substrate 12. The etch may be performed at increased pressure, which causes undercutting and produces a trimmed mesa-type formation 24 with even better thermal isolation. The anisotropic etch may also be an angled etch, for example, an etch from an angle offset from the normal to integrated circuit substrate 12. An angled etch while rotating untrimmed mesa-type formation 22 would also provide some undercutting to produce a trimmed mesa-type formation 24 with even better thermal isolation.

Since mesa strip conductor 18 and bump-bonding material 20 are used as etch masks, the anisotropic etch is self-aligning. Therefore, given various geometries and misalignments of mesa strip conductor 18 and bump-bonding material 20, the final anisotropic etch will reduce the mesa material in trimmed mesa-type formation 24. Bump-bonding material 20 in FIG. 1 is shown misaligned to mesa strip conductor 18. A perfect alignment would place bump-bonding material 20 completely on mesa strip conductor 18 without overlap. However, as shown in FIG. 1, the anisotropic etch substantially reduces the mesa material in trimmed mesa-type formation 24, despite the misalignment of bump-bonding material 20.

Figure 2:
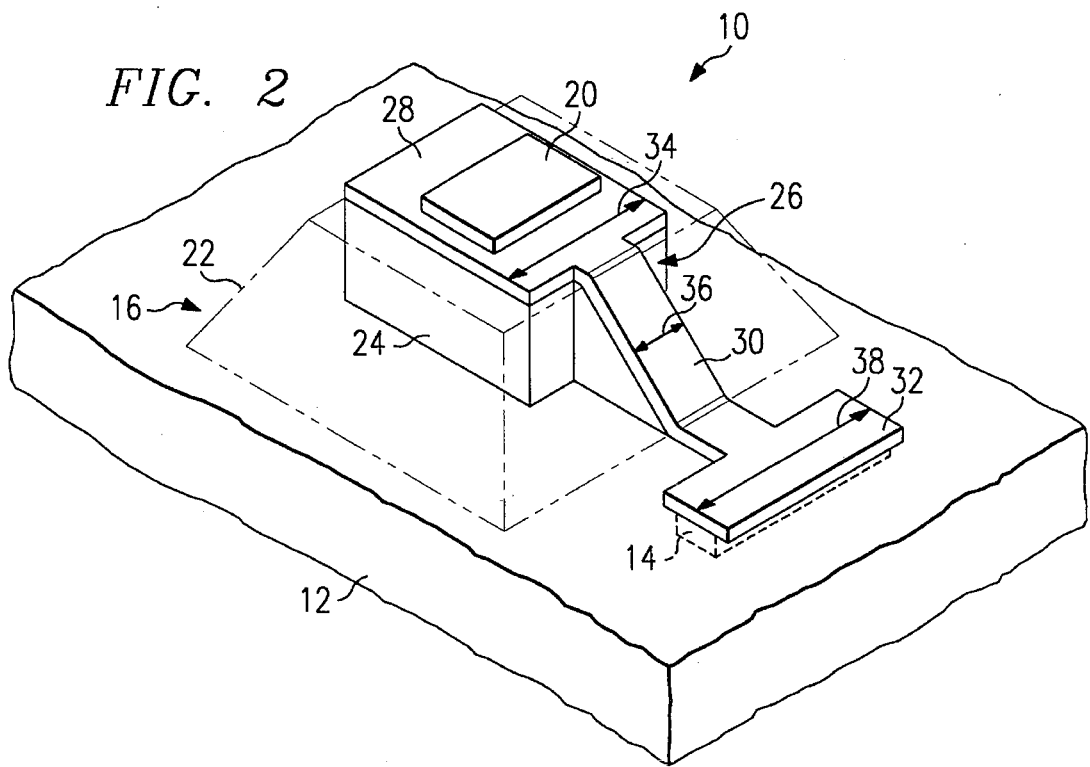
FIG. 2 is an isometric drawing showing a thermal isolation structure with excess mesa material removed as in FIG. 1, and also showing a mesa strip conductor with an oversized bonding area and contact region and a relatively narrow signal lead.

FIG. 2 shows an alternative embodiment of thermal isolation structure 10 using a variable geometry mesa strip conductor 26. Mesa strip conductor 26 provides a bonding area 28 to withstand the forces of bonding and improve electrical coupling between focal plane array (not shown) and thermal isolation structure 10. Voltage lead 30 electrically couples bonding area 28, and therefore focal plane array, to contact region 32. Contact region 32 couples voltage lead 30 to contact pad 14 on integrated circuit substrate 12.

The geometry of mesa strip conductor 26 may be described in part by specifying the width of bonding area 28, voltage lead 30, and contact region 32. It should be understood that using the width to describe relevant sections of mesa strip conductor 26 is only a matter of convenience. For example, the geometry of mesa strip conductor 26 may similarly be described using total surface area or other appropriate geometrical measure. In general, bonding area width 34 is greater than voltage lead width 36. In one embodiment, contact region width 38 is also greater than voltage lead width 36.

By increasing the bonding area width 34 and consequently the total surface area of bonding area 28, mesa strip conductor 26 provides a large area to withstand the forces of bonding and insure a satisfactory electrical coupling between focal plane array and thermal isolation structure 10. As described above, bump-bonding material 20 may be placed on bonding area 28 to facilitate bonding of thermal isolation structure 10 to focal plane array. Voltage lead width 36 is less than bonding area width 34 to minimize thermal conduction between focal plane array and integrated circuit substrate 12 through mesa strip conductor 26. In one embodiment, contact region width 38 is also greater than voltage lead width 36 to reduce misalignment sensitivity of thermal isolation structure 10 to contact pad 14 of integrated circuit substrate 12. In a similar fashion, the length of bonding area 28 and contact region 32 may be increased in accordance with the teachings of the present invention. Oversized bonding area 28 and contact region 32 act as electrical nodes and narrow voltage lead 30 reduces thermal conduction between these two nodes.

Untrimmed mesa-type formation 22, shown in phantom lines, may be trimmed by an anisotropic etch, described above, using mesa strip conductor 26 and optionally bump-bonding material 20 as an etch mask. Trimmed mesa-type formation 24 provides adequate structural support during bump-bonding with the associated focal plane array while reducing the amount of mesa material and improving thermal isolation.

Figure 3:
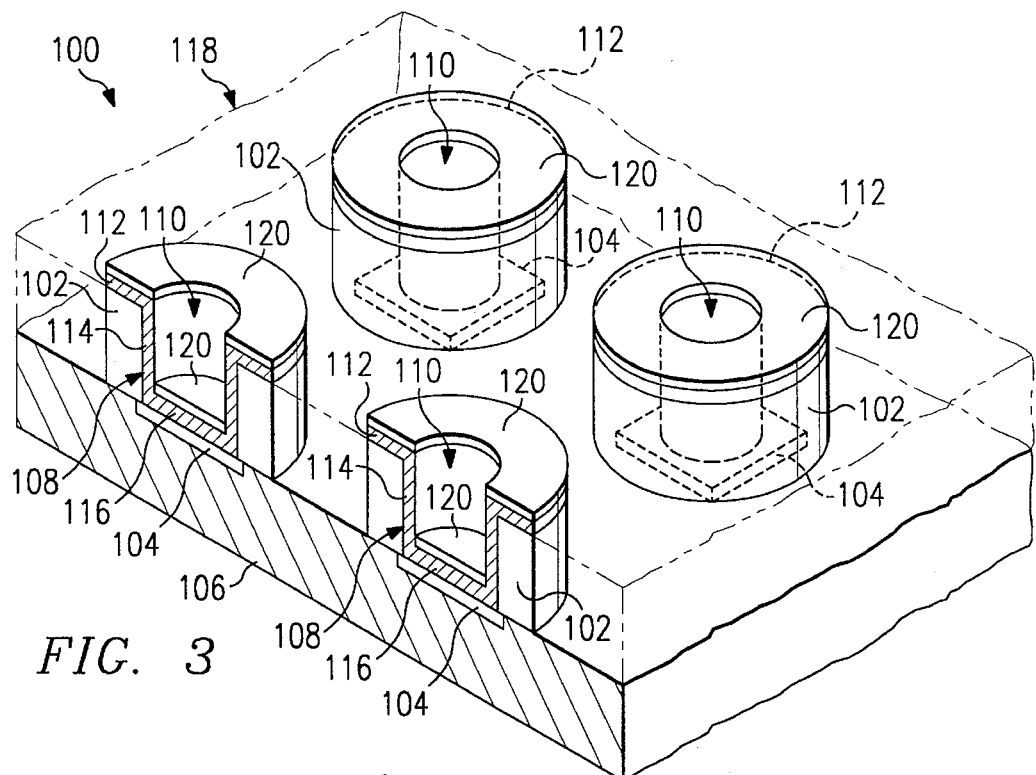
FIG. 3 is an isometric drawing showing a thermal isolation structure comprising mesa-type formations disposed over contact pads of the integrated circuit substrate and providing a conductor through the center of the mesa-type formation which couples the top of the mesa-type formation to the underlying contact pad.

Now referring to FIG. 3, thermal isolation structure 100 comprises mesa-type formations 102 disposed over contact pads 104 of integrated circuit substrate 106. Thermal isolation structure 100 provides mechanical support during bonding of focal plane array 132 (See FIG. 4) with integrated circuit substrate 106. Thermal isolation structure 100 also thermally insulates focal plane array from integrated circuit substrate 12 and provides an electrical coupling between focal plane array and the integrated circuit substrate 12.

Mesa-type formations 102 are formed from an appropriate mesa material 118, such as polyimide or other thermally insulating material. Mesa material 118 is deposited in a uniform thickness on integrated circuit substrate 106. Associated with each mesa-type formation 102 is a conductor 108 disposed partially in a hole or via 110 etched vertically through the middle of mesa-type formation 102. Conductor 108 comprises a bonding area 112 disposed on top of mesa-type formation 102 for coupling focal plane array to thermal isolation structure 100, a voltage lead 114 at least partially covering the vertical walls of via 110, and contact region 116 overlying contact pad 104 of integrated circuit substrate 106. In one embodiment, bump-bonding material 120 is placed on bonding area 112 to facilitate bonding between focal plane array and integrated circuit substrate 106. During the fabrication process, some of bump-bonding material 120 may deposit on contact region 116 of conductor 108, as shown in FIG. 3.

Conductor 108 provides electric coupling between the associated focal plane array and integrated circuit substrate 106. The effective width or circumference of voltage lead 114 of conductor 108 is defined by the diameter of via 110 formed in the middle of mesa-type formation 102. An anisotropic etch of mesa-type formation 102 may be used to form via 110 to very exacting tolerances. The thickness of voltage lead 114 deposited on the inner walls of via 110 can be closely regulated by using a conformal deposition technique, such as chemical vapor deposition (CVD). A thin voltage lead 114 substantially improves thermal isolation between focal plane array and integrated circuit substrate 106.

Thermal isolation between focal plane array and integrated circuit substrate 106 may also be improved by performing an anisotropic etch on excess mesa material 118 using bonding area 112 of conductor 108 as an etch stop. During the anisotropic etch, all mesa material 118 covering integrated circuit substrate 106 is removed, except for the mesa material directly beneath bonding area 112 of conductor 108. In one embodiment, bump-bonding material 120 may be placed on bonding area 112 of conductor 108 and used as an etch mask during the anisotropic etch of mesa material 118. Conductor 108 and bump-bonding material 120 may be deposited and patterned simultaneously or in separate process steps. The anisotropic etch may be an oxygen-based reactive ion etch (RIE) or a magnetically-enhanced reactive ion etch (MERIE). As described below, a similar etch is used to form via 110.

Conductor 108 may be formed from a titanium/tungsten alloy or any other appropriate conductor. Mesa material 118 may be conventional polyimide, photosensitive polyimide, or other appropriate thermally insulating material. Bump-bonding material 120 may be indium, or any other satisfactory material to aid in the bonding of focal plane array to thermal isolation structure 100. The choice of materials for mesa-type formation 102, conductor 108, and bump-bonding material 120 is largely dependant upon thermal isolation, structural rigidity, and signal transport considerations.

Mesa-type formations 102 in FIG. 3 are shown with a circular cross section, but it should be understood that the present invention contemplates mesa-type formations 102 of any cross section. The external walls of mesa-type formation 102 after an anisotropic etch are shown to be vertical, however, it should be understood that they may be sloping, bulged in the middle, or in any other alternate configuration. Similarly, via 110 is shown with vertical walls, but these walls may also be in alternative configurations.

A typical process sequence for forming thermal isolation structure 100 begins with forming and curing a substantially uniform layer of non-photosensitive polyimide mesa material 118 on integrated circuit substrate 106. A via etch mask material, such as silicon dioxide ($SiO_2$), aluminum, or titanium/tungsten alloy, is then deposited. After a via resist pattern is applied the masking material is etched. Via 110 is etched into mesa material 118 using an appropriate anisotropic etch such as RIE or MERIE. Contact pad 104 may be used as an etch stop when performing this step. The masking material is then removed leaving mesa material 118 with vias 110 etched down to contact pads 104 of integrated circuit substrate 106.

A suitable electrical interconnect material is then deposited on the surface of mesa material 118, the interior walls of via 110, and contact pad 104 to form bonding area 112, voltage lead 114, and contact region 116 of conductor 108, respectively. Conductor 108 may be formed from any appropriate conductive material, such as a titanium/tungsten alloy. The thickness of voltage lead 114 formed on the interior walls of via 110 can be closely regulated by use of a conformal deposition technique such as chemical vapor deposition (CVD). A thin voltage lead 114 improves thermal isolation between focal plane array and integrated circuit substrate 106. If desired, bump-bonding material 120 can also be deposited on conductor 108 using a similar technique.

Bonding area 112 and bump-bonding material 120 are then patterned and etched, either simultaneously or in separate process steps. FIG. 3 shows bonding area 112 and bump-bonding material 120 patterned into a circular area surrounding via 110. It should be understood that bonding area 112 and bump-bonding material 120 may be patterned in any appropriate shape that surrounds via 110.

After patterning bonding area 112 and bump-bonding material 120, an anisotropic etch removes excess mesa material 118 not directly underlying bonding area 112 and bump-bonding material 120. Any appropriate anisotropic etch, such as RIE or MERIE, may be used. As described above with reference to FIG. 1, the anisotropic etch may be normal to integrated circuit substrate 106 or an angled etch while rotating mesa-type formation 102 to provide some undercutting and achieve even better thermal isolation. The resulting mesa-type formation 102 is self-aligned over its respective contact pad 104 and trimmed of excess mesa material 118 to improve thermal isolation, A similar process sequence forms and low-temperature cures a substantially uniform layer of photosensitive polyimide mesa material 118 on integrated circuit substrate 106. Mesa material 118 is then exposed with via patterns and the patterns are developed to form vias 110. Mesa material 118 is then high-temperature cured.

As described above, a suitable interconnect material is then deposited using a conformal deposition technique to cover the top of mesa-type formation 102, the interior walls of via 110, and contact pad 104 to form bonding area 112, voltage lead 114, and contact region 116 of conductor 108, respectively. If desired, bump-bonding material 120 can also be applied, as described above. Conductor 108 is then patterned and etched to produce the final shape of bonding area 112. Excess mesa material 118 is then trimmed using an anisotropic etch, such as RIE or MERIE, that uses bonding area 112 and optionally bump-bonding material 120 as an etch mask.

Thermal isolation structure 100 offers the significant advantage of self-alignment of mesa-type formations 102 to contact pads 104 of integrated circuit substrate 106. This allows a significant reduction in alignment error and greater flexibility in placement of mesa-type formations 102. The above process allows conductor 108 to be reliably deposited and coupled to contact pads 104.

A further advantage of the process described above and the resulting thermal isolation structure 100 shown in FIG. 3, is that voltage lead 114 may be formed out of a very thin deposition of interconnect material. A conformal deposition technique such as chemical vapor deposition (CVD) can use substantially less material in forming voltage lead 114 than traditional photolithography techniques. By using less material to form voltage lead 114, thermal isolation between bonding area 112 and contact region 116, and in turn thermal isolation between focal plane array and integrated circuit substrate 106, can be greatly enhanced.

Thermal isolation structure 100 also eliminates the problem of maintaining accurate photoresist resolution on two levels. Vias 110 and bonding area 112 are patterned on a single level, allowing for very good photoresist resolution. Therefore, a particular advantage of this process is the potential of forming taller mesa-type formations 102 with increased thermal isolation without introducing multiple level photolithographic problems.

Thermal isolation structure 100 also incorporates a final anisotropic etch using bonding area 112 and optionally bump-bonding material 120 as a mask in removing excess mesa material 118. Only the portions of mesa material 118 that are directly underlying bonding area 112 and providing structural support remain after the anisotropic etch. Therefore, by reducing the cross section of mesa-type formation 102, the final anisotropic etch also reduces the amount of mesa material 118 used in thermal isolation structure 100, thereby reducing total thermal conduction between focal plane array and integrated circuit substrate 106.

Figure 4:
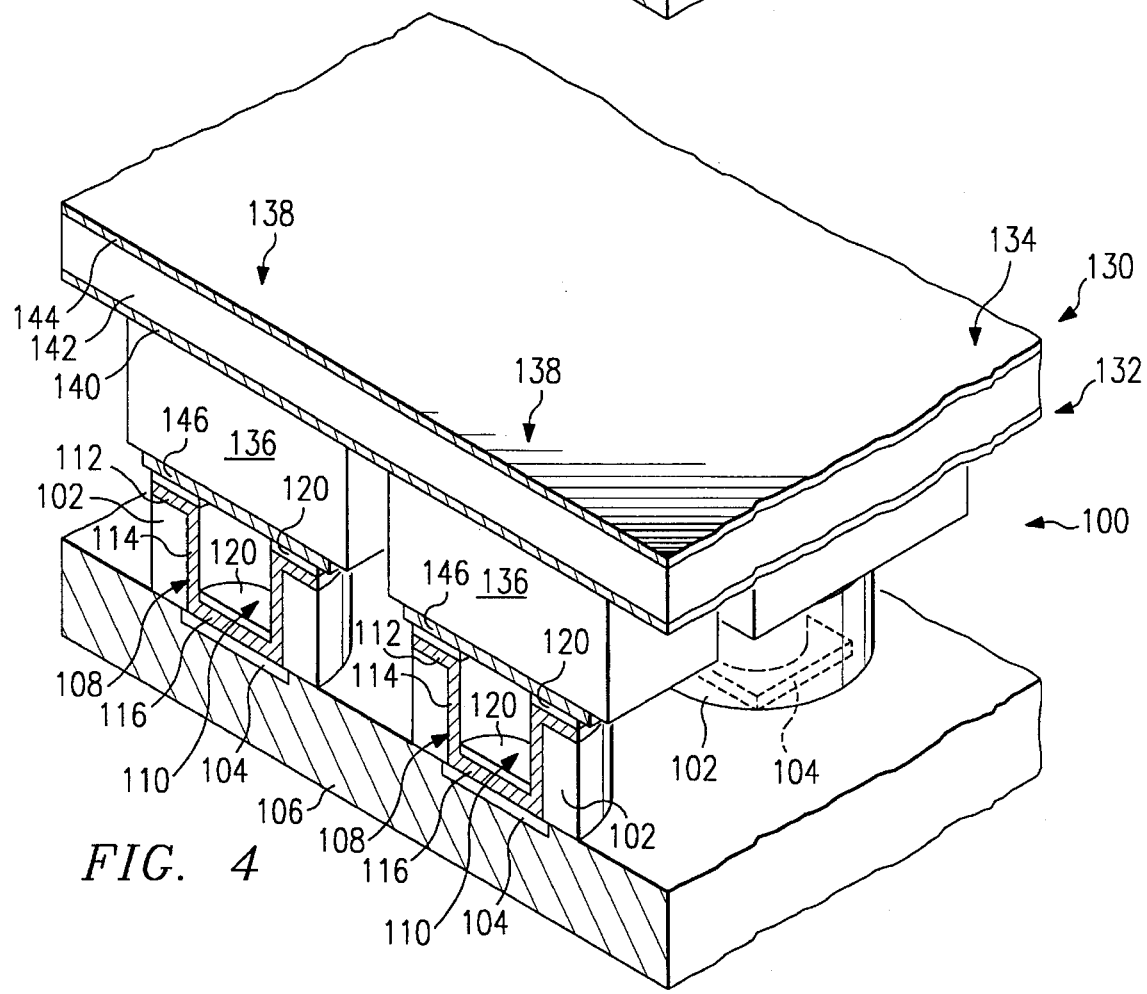
FIG. 4 is a schematic representation in elevation and in section with portions broken away showing a portion of a hybrid thermal detector having a focal plane array, thermal isolation structure, and integrated circuit substrate incorporating one embodiment of the present invention.

FIG. 4 illustrates a portion of hybrid thermal detector 130 having a focal plane array 132 mounted on thermal isolation structure 100 described above with reference to FIG. 3. In general, thermal isolation structure 100 provides mechanical support during bonding of focal plane array 132 to integrated circuit substrate 106. Thermal isolation structure 100 also thermally insulates focal plane array 132 from integrated circuit substrate 106 and provides electrical coupling between focal plane array 132 and integrated circuit substrate 106. Therefore, thermal isolation structure 100 provides the multiple functions of structural support, thermal isolation, and electrical coupling between focal plane array 132 and integrated circuit substrate 106.

It should be understood that the present invention contemplates coupling focal plane array 132 to thermal isolation structure 100 as described with reference to FIG. 3, or to thermal isolation structure 10 as shown in FIGS. 1 or 2. Furthermore, any appropriate focal plane array which provides a sensor signal output representative of incident infrared radiation may be coupled to thermal isolation structures 10 and 100 disclosed in FIGS. 1–3.

Thermal detector 130 produces a thermal image in response to incident infrared radiation striking focal plane array 132. The principal components of focal plane array 132 include infrared absorber and common electrode assembly 134 coupled to pyroelectric elements 136 to form thermal sensors 138. In the preferred embodiment, focal plane array 132 includes one hundred or more thermal sensors 138. For one application barium strontium titanate (BST) may be used to form pyroelectric elements 136. Also, materials in the lead titanate family including lead titanate (PT), lead lanthanum titanate (PLT), lead zirconium titanate (PZT), and lead lanthanum zirconium titanate (PZLT) may be used to form pyroelectric elements 136 for use with thermal detection systems incorporating the present invention.

Each thermal sensor 138 may be associated with at least one mesa-type formation 102 of thermal isolation structure 100. Thermal sensor 138 comprises pyroelectric element 136 coupled to a corresponding section of infrared absorber and common electrode assembly 134 overlying pyroelectric element 136. Infrared absorber and common electrode assembly 134 further comprises common electrode 140, optical coating 142, and optionally thin outer layer 144. Sensor signal electrode 146 is coupled to the other side of pyroelectric element 136.

The quantity and configuration of thermal sensors 138 depends on the desired N by M pixel resolution of focal plane array 132. The pyroelectric transducer or capacitor associated with each thermal sensor 138 is defined in part by pyroelectric element 136, sensor signal electrode 146, and common electrode 140. Therefore, pyroelectric element 136 functions as a dielectric with respect to signal sensor electrode 146 and common electrode 140.

In operation, thermal detector 130 produces a thermal image in response to incident infrared radiation striking focal plane array 132. Infrared absorber and common electrode assembly 134 absorbs infrared energy and transfers a temperature change to pyroelectric element 136 of thermal sensor 138. The temperature change alters the electrical polarization and capacitance of pyroelectric element 136 and produces a representative sensor signal appearing on sensor signal electrode 146. The total sensor signal output from thermal sensor 138 will depend upon the electrical polarization and capacitance of pyroelectric element 136, which in turn is a function of the incident infrared radiation. The sensor signal output then passes through conductor 108 of thermal isolation structure 100 to an associated contact pad 104 disposed on integrated circuit substrate 106.

Although the present invention has been described with several embodiments, various and changes and modifications may be suggested to one skilled in the art, and it is intended that the present invention encompass such changes and modifications as fall within the scope of the appended claims.

What is claimed is:

1. A hybrid thermal detector including a focal plane array mounted with a thermal isolation structure on an integrated circuit substrate, comprising:

at least three thermal sensors in the focal plane array for generating a sensor signal output representative of the thermal radiation incident to the focal plane array;

at least three contact pads, disposed on the integrated circuit substrate, for coupling the integrated circuit substrate to the focal plane array;

at least three mesa-type formations projecting adjacent to the contact pads of the integrated circuit substrate;

at least three mesa strip conductors extending from the top of the mesa-type formations to the contact pads of the integrated circuit substrate, each mesa strip conductor coupling at least one of the thermal sensors in the focal-plane array to an associated contact pad of the integrated circuit substrate; and each mesa strip conductor comprising a bonding area having a bonding area width, disposed on the top of the mesa-type formation, for coupling to the focal plane array and a voltage lead having a voltage lead width coupling the bonding area to an associated contact pad, wherein the mesa-type formation associated with each mesa strip conductor is substantially defined by a vertical projection of the mesa strip conductor on the integrated circuit substrate.

2. The detector of claim 1, further comprising bump-bonding material deposited on at least the bonding area of each mesa strip conductor.

3. The detector of claim 1, wherein the voltage lead width is less than the bonding area width.

4. The detector of claim 1, wherein each mesa strip conductor further comprises a contact region having a contact region width coupled to the voltage lead and at least partially disposed over the associated contact pad of the integrated circuit substrate, wherein the voltage lead width is less than the contact region width.

5. A hybrid thermal detector including a focal plane array mounted with a thermal isolation structure on an integrated circuit substrate, comprising:

at least three thermal sensors in the focal plane array for generating a sensor signal output representative of the thermal radiation incident to the focal plane array;

at least three contact pads, disposed on the integrated circuit substrate, for coupling the integrated circuit substrate to the focal plane array;

at least three mesa-type formations formed from thermally insulating material, the mesa-type formations disposed over the contact pads of the integrated circuit substrate;

at least three conductors extending vertically from the top of the mesa-type formations to the contact pads of the integrated circuit substrate, each conductor having an associated mesa-type formation; and each conductor comprising a bonding area disposed on the top of the associated mesa-type formation and a voltage lead disposed in a via formed in the center of the associated mesa-type formation, the voltage lead coupling the top of the associated mesa-type formation to an associated contact pad of the integrated circuit substrate, the associated mesa-type formation substantially defined by a vertical projection of the bonding area on the integrated circuit substrate.

6. The detector of claim 5, and further comprising bump-bonding material deposited on the bonding area of the conductors.

7. The detector of claim 5, wherein the mesa-type formations are formed from polyimide.

8. The detector of claim 5, wherein the mesa-type formations have a substantially circular cross section.

* * * * *